(12) United States Patent  
Jereza

(10) Patent No.: US 7,898,067 B2  
(45) Date of Patent: Mar. 1, 2011

(54) PRE-MOLDED, CLIP-BONDED MULTI-DIE SEMICONDUCTOR PACKAGE

(75) Inventor: Armand Vincent C. Jereza, Cebu (PH)

(73) Assignee: Fairchild Semiconductor Corporaton

( * ) Notice: Subject to any disclaimer, the term of this patent is extended or adjusted under 35 U.S.C. 154(b) by 255 days.

(21) Appl. No.: 12/262,486

(22) Filed: Oct. 31, 2008

(65) Prior Publication Data

US 2010/0109134 A1     May 6, 2010

(51) Int. Cl.  
*H01L 23/495* (2006.01)

(52) U.S. Cl. ......... 257/670; 257/672; 257/723; 257/685; 257/E25.031; 257/E25.032; 257/E23.042; 257/E25.005; 257/E25.011; 257/E25.015; 257/E25.02; 257/E25.026; 438/6; 438/28; 438/66; 438/67; 438/107; 438/406; 438/455; 438/458

(58) Field of Classification Search .......... 257/666–670, 257/672, 723, E25.005, E25.011, E25.015, 257/E25.016, E25.02, E25.026, E25.031–E25.032, 257/E23.042; 438/6, 28, 66, 67, 107, 109, 438/406, 455–459, FOR. 211–FOR. 220, 438/FOR. 365–FOR. 368, 111, 112, 123, 438/FOR. 366, FOR. 367, FOR. 377, FOR. 380  
See application file for complete search history.

(56) References Cited

U.S. PATENT DOCUMENTS

| | | | | |
|---|---|---|---|---|
| 6,093,961 | A * | 7/2000 | McCullough | 257/718 |
| 6,624,522 | B2 * | 9/2003 | Standing et al. | 257/782 |
| 6,777,800 | B2 * | 8/2004 | Madrid et al. | 257/690 |
| 6,784,540 | B2 * | 8/2004 | Cardwell | 257/722 |
| 7,332,806 | B2 * | 2/2008 | Joshi et al. | 257/706 |
| 7,838,340 | B2 * | 11/2010 | Cruz et al. | 438/124 |
| 2005/0161785 | A1 | 7/2005 | Kawashima et al. | |
| 2007/0231968 | A1 | 10/2007 | Jacob et al. | |
| 2008/0197507 | A1 | 8/2008 | Yang | |
| 2009/0190320 | A1 | 7/2009 | Shimizu et al. | |

FOREIGN PATENT DOCUMENTS

JP     4-96356     *  3/1992 .................... 257/666

OTHER PUBLICATIONS

User Guide for IR3820A Evaluation Board, International IR Rectifier, Rev. 0.0 Jan. 7, 2008, pp. 1-16, IRDC3820A.  
Highly Integrated 14 A Wide-Input Voltage, Synchronous Buck Regulator, International IR Rectifier, Jan. 8, 2008, pp. 1-21, PD-60330, IR3820AMPbF.  
FDMF6730 Driver plus FET Multi-chip Module, Fairchild Semiconductor Corporation, FDMF6730 Rev. D2, Aug. 2008, pp. 1-10.  
6A, 24 V Input, Integrated Synchronous Buck Regulator, Fairchild Semiconductor Corporation, FAN2106-Tiny Buck Rev. 1.0.8, May 2008, pp. 1-14.

* cited by examiner

*Primary Examiner* — Jasmine J Clark  
(74) *Attorney, Agent, or Firm* — Kirton & McConkie; Kenneth Horton

(57) ABSTRACT

Semiconductor packages that contain multiple dies and methods for making such packages are described. The semiconductor packages contain a leadframe with multiple dies and also contain a single premolded clip that connects the dies. The premolded clip connects the solderable pads of the source die and gate die to the source and gate of the leadframe via standoffs. The solderable pads on the dies and on the standoffs provide a substantially planar surface to which the premolded clip is attached. Such a configuration increases the cross-sectional area of the interconnection when compared to wirebonded connections, thereby improving the electrical ($RDS_{on}$) and the thermal performance of the semiconductor package. Such a configuration also lowers costs relative to similar semiconductor packages that use wirebonded connections. Other embodiments are described.

25 Claims, 7 Drawing Sheets

PRE-MOLDED, CLIP-BONDED MULTI-DIE SEMICONDUCTOR PACKAGE

FIELD

This application relates generally to semiconductor devices and methods for making such devices. More specifically, this application describes semiconductor packages that contain multiple dies and methods for making such packages.

BACKGROUND

Semiconductor packages are well known in the art. Often, these packages may include one or more semiconductor devices, such as an integrated circuit ("IC") die, which may be connected to a die pad that is centrally formed in a lead frame. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

In most instances, each semiconductor package only contains a single die that contains an IC device. Thus, the functionality of each semiconductor package is often limited to the functions of that particular IC device which the die contains.

SUMMARY

This application relates to semiconductor packages that contain multiple dies and methods for making such packages. The semiconductor packages contain a leadframe with multiple dies and also contain a single premolded clip that connects the dies. The premolded clip connects the solderable pads of the source die and gate die to the source and gate of the leadframe via standoffs. The solderable pads on the dies and on the standoffs provide a substantially planar surface to which the premolded clip is attached. Such a configuration increases the cross-sectional area of the interconnection when compared to wirebonded connections, thereby improving the electrical ($RDS_{on}$) and the thermal performance of the semiconductor package. Such a configuration also lowers costs relative to similar semiconductor packages that use wirebonded connections.

BRIEF DESCRIPTION OF THE DRAWINGS

The following description can be better understood in light of the Figures, in which.

Figure 1:
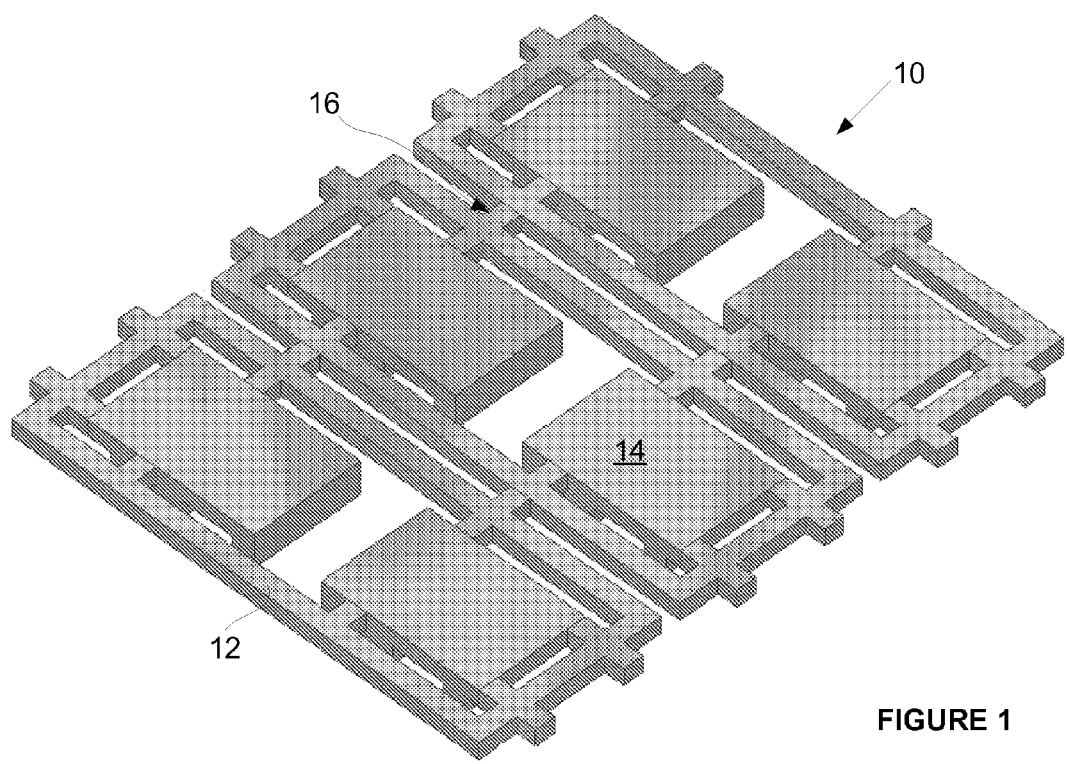
FIG. 1 shows some embodiments of a panelized premolded clip that is used to manufacture a semiconductor package.

The Figures illustrate specific aspects of the semiconductor packages that contain multiple dies and methods for making such packages. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor packages and associated methods of using the packages can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the IC industry, it could be used for and applied to other electronic devices like optoelectronic devices, solar cells, MEMS structures, lighting controls, power supplies, and amplifiers.

Some embodiments of the semiconductor packages that contain multiple dies connected by a premolded clip and methods for making such packages are shown in the Figures. In some embodiments, the semiconductor devices are provided in the form of a quad, flat no-lead (QFN) semiconductor package. In other embodiments, the semiconductor devices are provided in the form of a power quad, flat no-lead (PQFN) semiconductor package.

The semiconductor packages can be made using any methods that provides the structures illustrated and described herein. In some embodiments, the method for making a semiconductor package provides a first leadframe that is used to create a premolded clip. As illustrated in FIG. 1, a first leadframe 10 is made as known in the art by metal stamping or etching to create a frame 12 that contains multiple panels 14 with the desired shapes that are connected to each other by tie bars 16. The leadframe 10 can be made of any electrically conductive material known in the art, including Cu, Cu alloy, Ni—Pd, Ni—Pd—Au, or combinations thereof. In some embodiments, the first leadframe 10 comprises Cu.

FIG. 1 depicts a leadframe 10 with six separate panels 14. Each pair of the panels can be separated from the tie bars 16 between the panels and used as the premolded clip as described herein. Thus, each leadframe 10 can be used to make 3 premolded clips, each of which is made from a pair of panels 14. The leadframe 10 could be configured with as few as 2 panels (to make 1 premolded clip) and as many multiple panels (to make one half as many premolded clips) as desired, provided the overall dimension on the leadframe will fit into the molding equipment.

Figure 2:
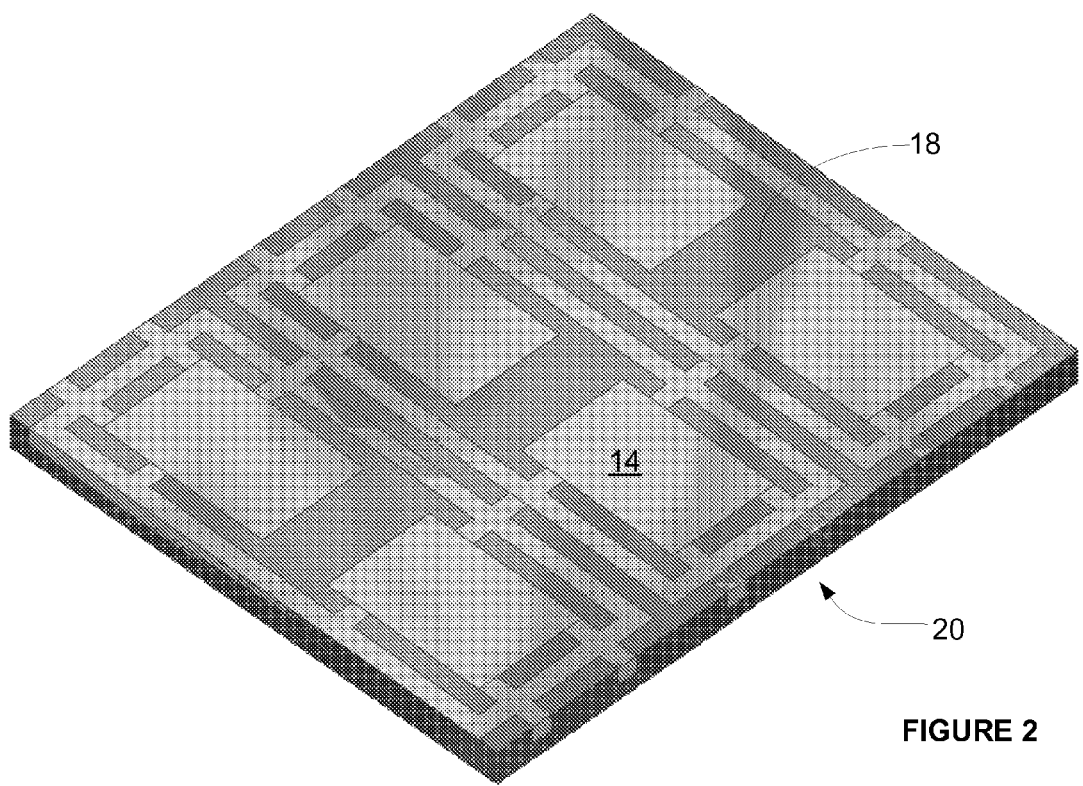
FIG. 2 shows some embodiments of a panelized molded clip that is used to manufacture a semiconductor package.

Next, as shown in FIG. 2, the leadframe 10 can be encapsulated with a molding material 18. The molding material 18 is formed around the sides of the panels and part of the bottom surface of the panels by any known encapsulation process, including potting, transfer molding, or injection. The resulting partially molded leadframe 20 containing the panels 14 is depicted in FIG. 2. The panels 14 are still connected to each other within the molded leadframe 20 via the tie bars 16.

Figure 3:
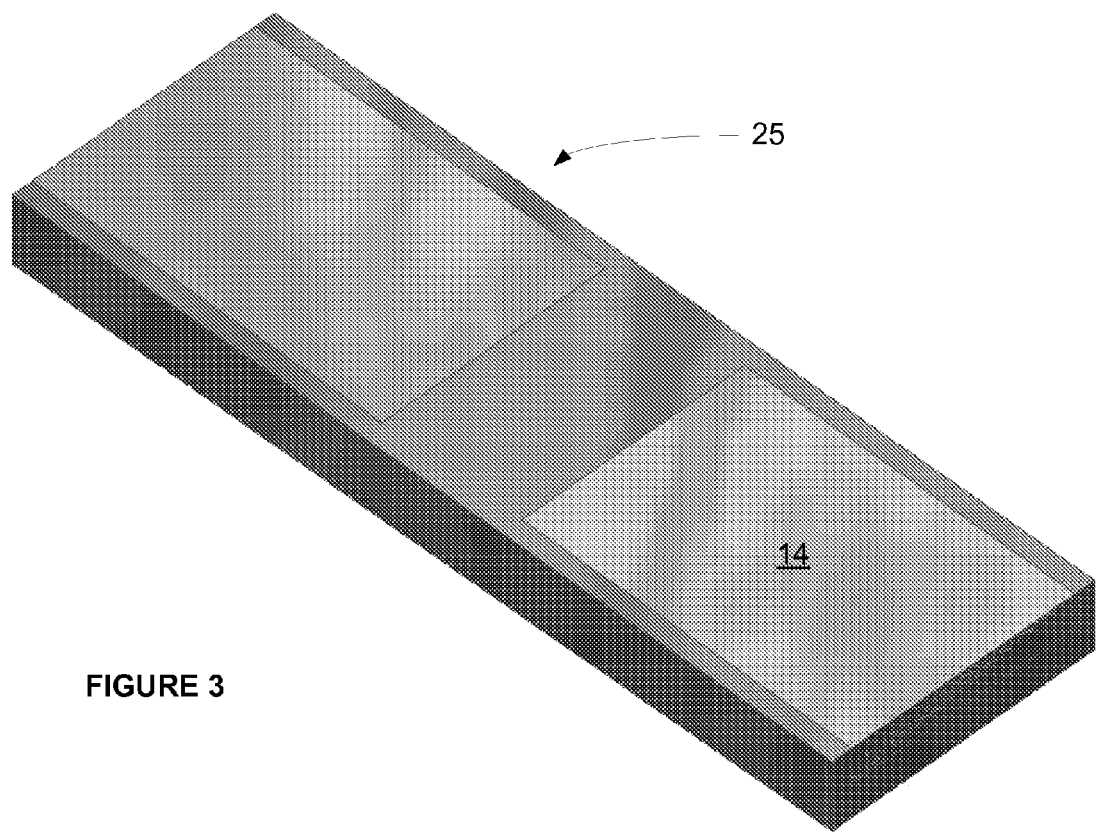
FIGS. 3 and 4 show respectively a top and bottom view of some embodiments of a premolded clip that is used in a semiconductor package.
Figure 4:
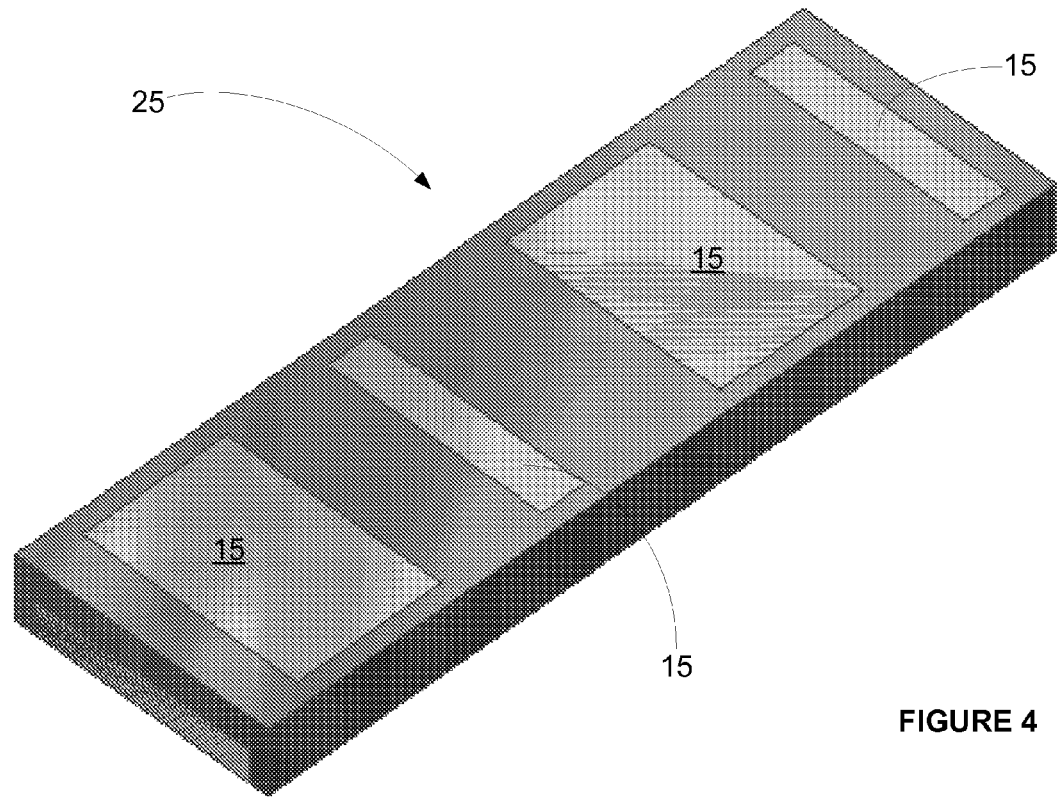

The molded leadframe 20 can then be separated into the individual molded clip leadframes 25 (or premolded clips) depicted in FIG. 3 (an upper view) and FIG. 4 (a bottom view). This separation can be performed using any process known in the art, including a punched singulation process or a saw singulation process. During this process, the tie bars 16 connecting the panels 14 are removed so that just the panels 14 remain. FIG. 4 illustrates that in some embodiments, the encapsulation process only covers part of the lower surfaces of the panels. The exposed surfaces 15 on the bottoms of the panels which are not encapsulated will be used as an interconnection surface.

Figure 5:
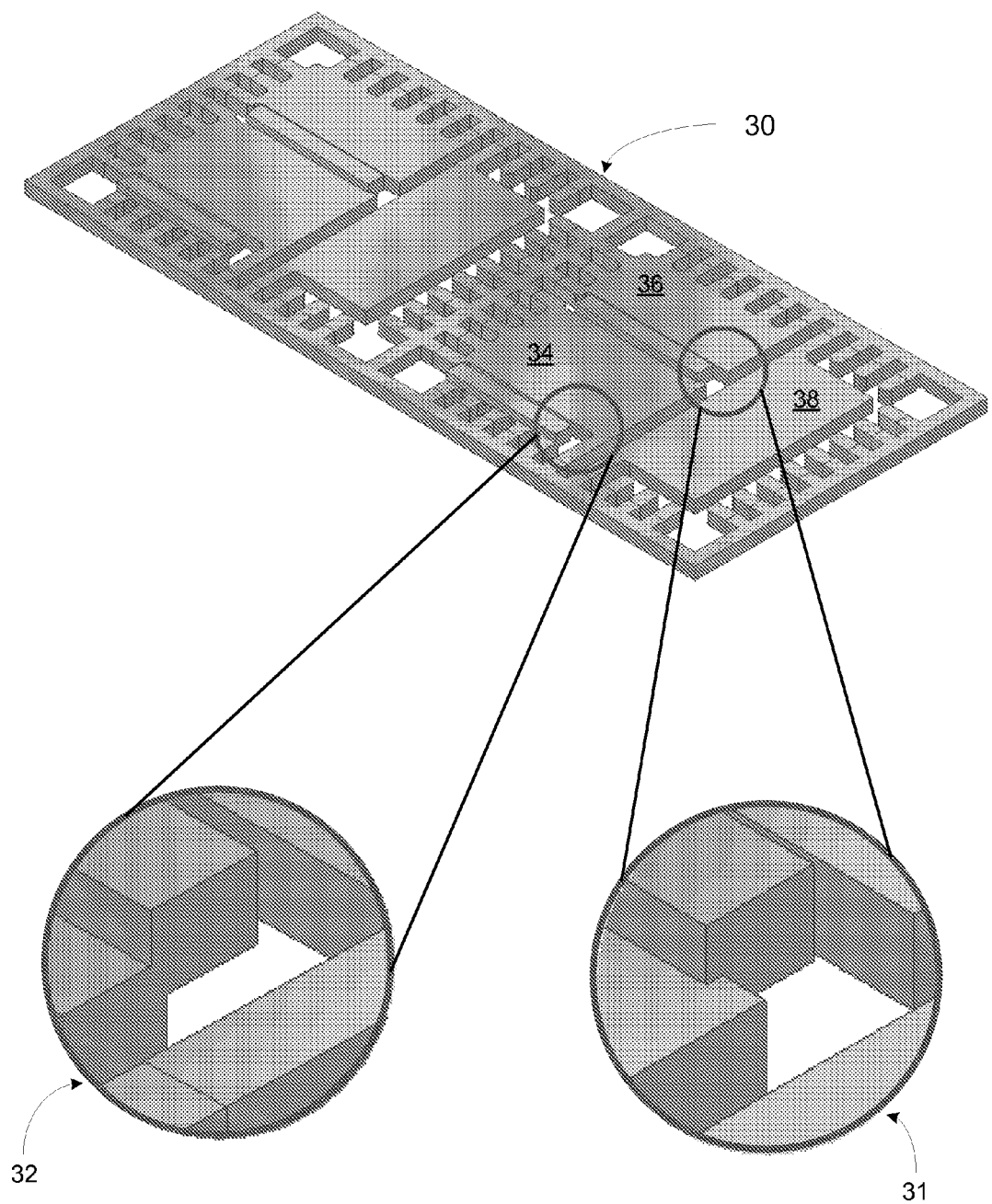
FIG. 5 depicts some embodiments of a leadframe that is used in a semiconductor package along with a close-up of a standoff feature.

Next, the leadframe for the semiconductor package (or base leadframe) can be provided. In some embodiments, the leadframe 30 is configured as depicted in FIG. 5 with 3 portions (die attach paddles or DAPs) 34, 36, and 38 on which the dies will be located. The leadframe 30 can be made as known in the art, for example, by metal stamping or etching. The leadframe 30 can be made of electrically conductive material known in the art, including Cu, Cu alloy, Ni—Pd, Ni—Pd—Au, or combinations thereof. In some embodiments, the leadframe 30 comprises Cu.

The leadframe 30 can be configured to minimize the length of topset feature needed for these dies that will later be placed on the leadframe 30. By minimizing the length of the topset feature, the length of the DAP can be increased. In some configurations, the topset feature is configured as a folded standoff 32 as depicted in FIG. 5. While FIG. 5 depicts two standoff features, the semiconductor packages can contain one standoff and can even contain 3 or more standoff features.

A close-up of this feature shows that the standoff 32 extends from the side of the leadframe 30 in a vertical direction. The standoff can have any length and width consistent with its function described herein. In some embodiments, the standoff can have a length of about 40 mils and a width of about 5 mils.

The standoff can be configured to be offset or flush relative to the adjacent edge of the leadframe or DAP. The embodiments where the standoff is configured as flush is depicted in FIG. 5 as standoff 32. The embodiments where the standoff is configured as being offset is depicted in FIG. 5 as standoff 31.

The extra length added by the standoff 32 (relative to the rest of the leadframe 30) depends on the thickness of the dies since the upper surface of the standoff 32 will be substantially planar with the upper surface of the dies that will be attached to the DAPs.

Figure 6:
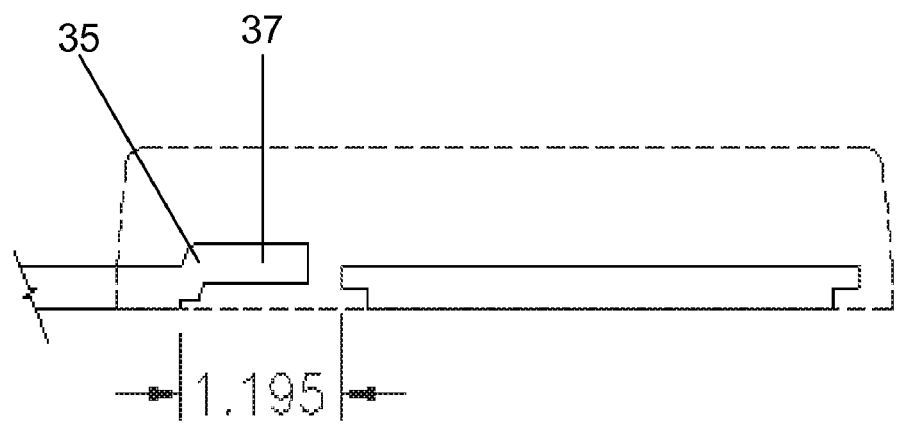
FIGS. 6A and 6B shows a comparison between the standoff feature in some embodiments with conventional topset features.
Figure 6:
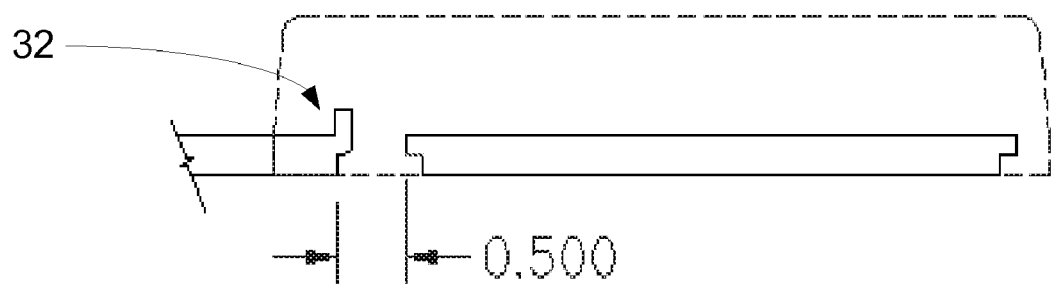
Figure 6:
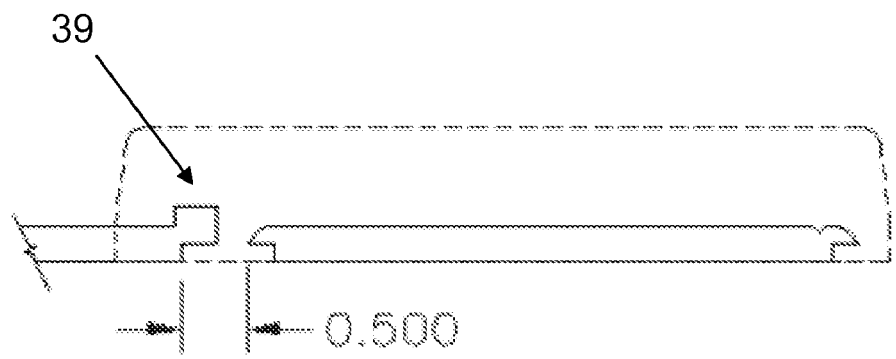

A comparison of the standoff feature with conventional topset features is depicted in FIGS. 6A and 6B. One conventional topset feature is shown in the top of FIG. 6A and comprises a short section 35 that extends upward and a longer section 37 that extends towards the adjacent section of the leadframe. Because of this conventional configuration, the conventional topset feature requires a distance of about 1.195 mm from one section of the leadframe (usually a DAP) to the next. Using the folded standoff configuration, however, allows this distance to be shortened to about 0.5 mm. In other embodiments, though, the standoff can be configured with a step feature 39 as depicted in FIG. 6B.

Figure 7:
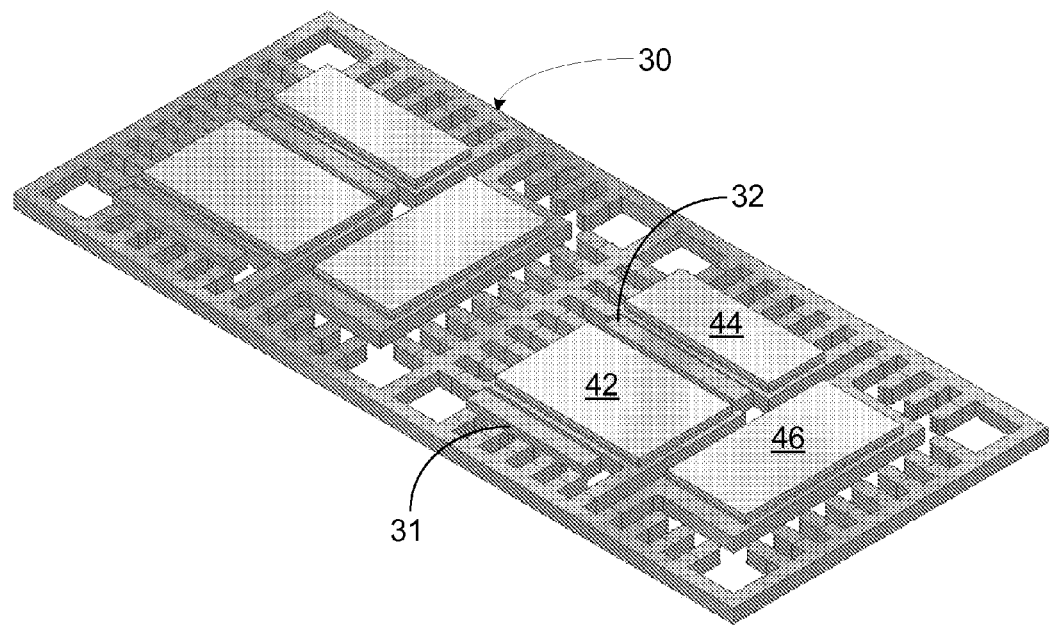
FIG. 7 depicts some embodiments of a leadframe with multiple dies that are used in a semiconductor package.

Once the leadframe 30 with the DAPs 34, 36, and 38 have been formed, the dies 42, 44, and 46 are then provided on this leadframe 30 as shown in FIG. 7. In the embodiments depicted in the Figures, three dies are used. But in other embodiments, 2 dies or even 4 or more dies can be used. The dies can be any semiconductor die known in the art, including those made of silicon or any other known semiconducting material.

In some embodiments, the dies can contain any IC device known in the art. The IC device in any given die may be the same or different than the IC device used in any other dies. Some non-limiting examples of the IC devices include audio amplifier, LDO, logic driver, signal switch, or combinations thereof.

In other embodiments, the dies can also contain a discrete device. The discrete device in any given die may be the same or different than the discrete device used in any other dies. Any discrete device known in the art can be used, including diodes and/or transistors. Examples of the discrete devices include zener diodes, schottky diodes, small signal diodes, bipolar junction transistors ("BJT"), metal-oxide-semiconductor field-effect transistors ("MOSFET"), insulated-gate-bipolar transistors ("IGBT"), insulated-gate field-effect transistors ("IGFET"), or combinations thereof. In some embodiments, the discrete device comprises a MOSFET device.

In yet other embodiments, the dies can also contain a passive device. The passive device in any given die may be the same or different than the passive device used in any other dies. Any passive device known in the art can be used, including capacitors, inductors, resistors, filters, or combinations thereof.

In still other embodiments, the dies can contain any combination of IC devices, discrete devices, and passive devices. For example, in the embodiments shown in the Figures, the die 42 contains a MOSFET, the die 44 contains a MOSFET, and the die 46 contains a controlling IC device.

The dies with the IC device(s), the passive device(s), and/or the discrete device(s) can be manufactured using any known processes. In some embodiments, the three dies can be manufactured separately. But in other embodiments, all of the dies can be manufactured at substantially the same time.

The dies can be attached to the leadframe 30 using any known processes. In some embodiments, this process includes a flip-chip process with solder bumping, which may include the use of solder bumps, balls, studs, and combinations thereof along with a solder paste, followed by a cure and reflow process. In other embodiments, the attachment process includes a flip chip process with the use of a conductive adhesive. The conductive adhesive may be, for example, a conductive epoxy, a conductive film, a screen printable solder paste, or a solder material, such as a lead-containing solder or a lead-free solder.

Figure 8:
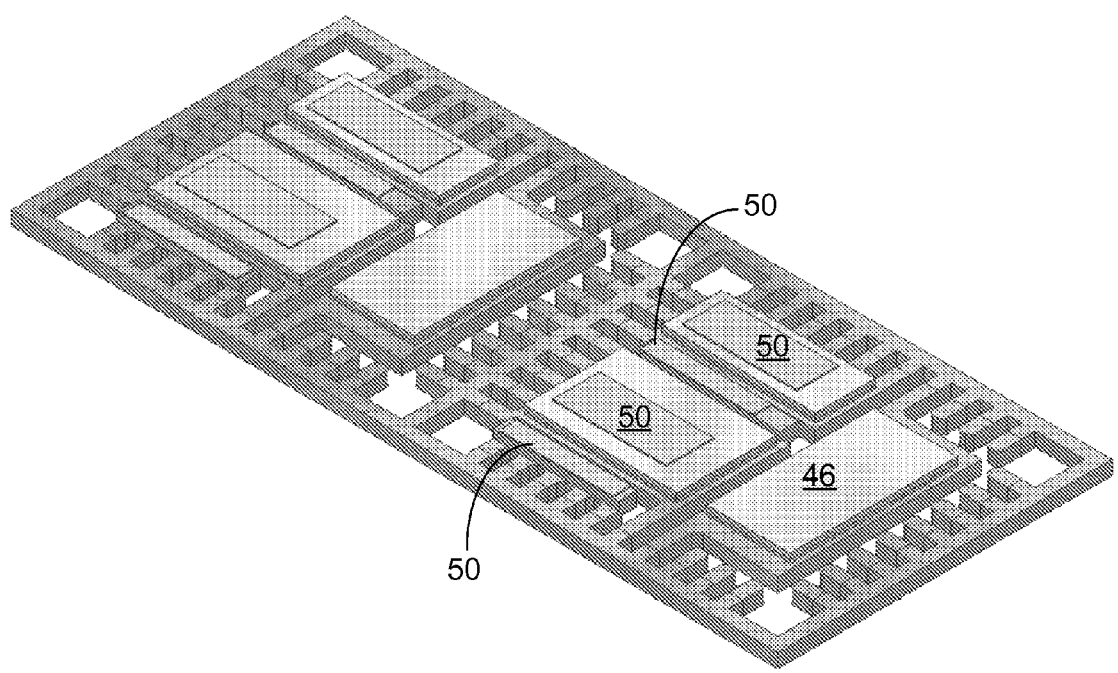
FIG. 8 depicts some embodiments of a solder paste that is applied to the dies and the standoff.

Next, the premolded clip 25 is attached to the desired dies (i.e., die 42 and die 44). This attachment can be done using any process known in the art. In some embodiments, the attachment process begins by providing any known solder paste 50 on the locations where the premolded clip will be attached. Thus, as shown in FIG. 8, the solder paste 50 is provided on the upper surfaces of die 42, die 44, and the upper surface of both standoffs 25. The solder paste 50 can be provided using any method known in the art.

The bottom surface of the premolded clip 25 is then attached to the dies using the solder paste 50. The premolded clip 25 is attached so that the exposed connections on the bottom surface of the premolded clip 25 are connected to the desired parts of the different devices contained in the dies. In some embodiments, the premolded clip 25 is attached to the die so that the source of die 42 is electrically connected through the leadframe to the drain of die 44. In some embodiments, the premolded clip could be attached to all 3 dies.

Figure 9:
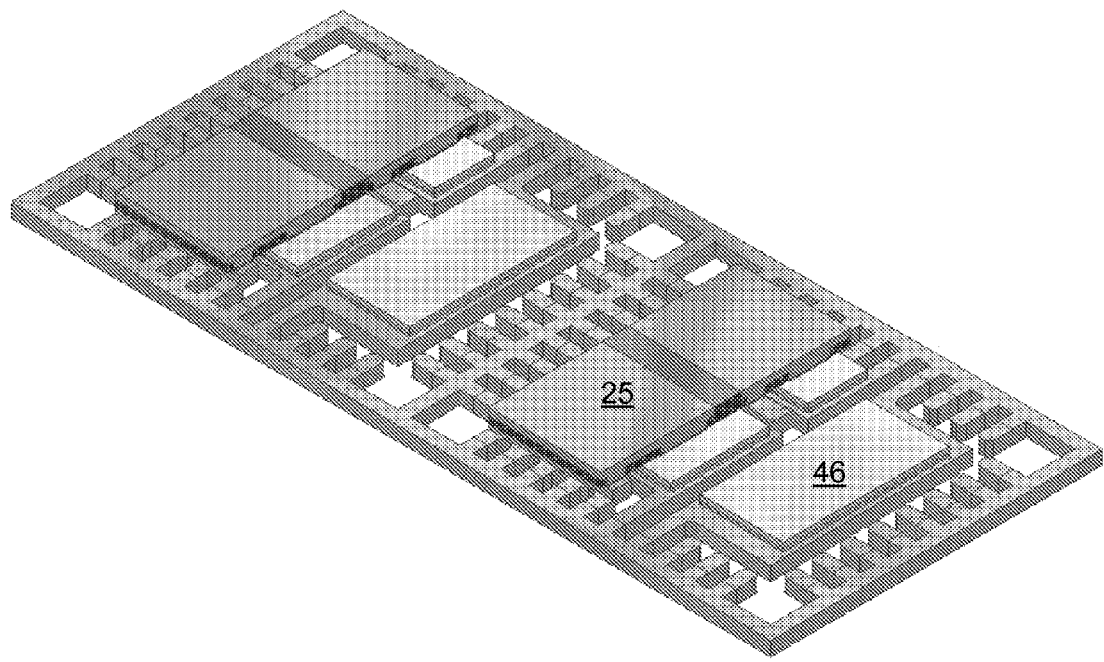
FIG. 9 depicts some embodiments of the premolded clip that can be used in a semiconductor package.

In the methods described above, the premolded clip 25 is made before the leadframe 30. In other embodiments, though, the premolded clip 25 can be made at substantially the same time or even after the leadframe 30 rather than being made before. The resulting structure after the clip leadframe has been attached to the desired dies is depicted in FIG. 9.

Figure 10:
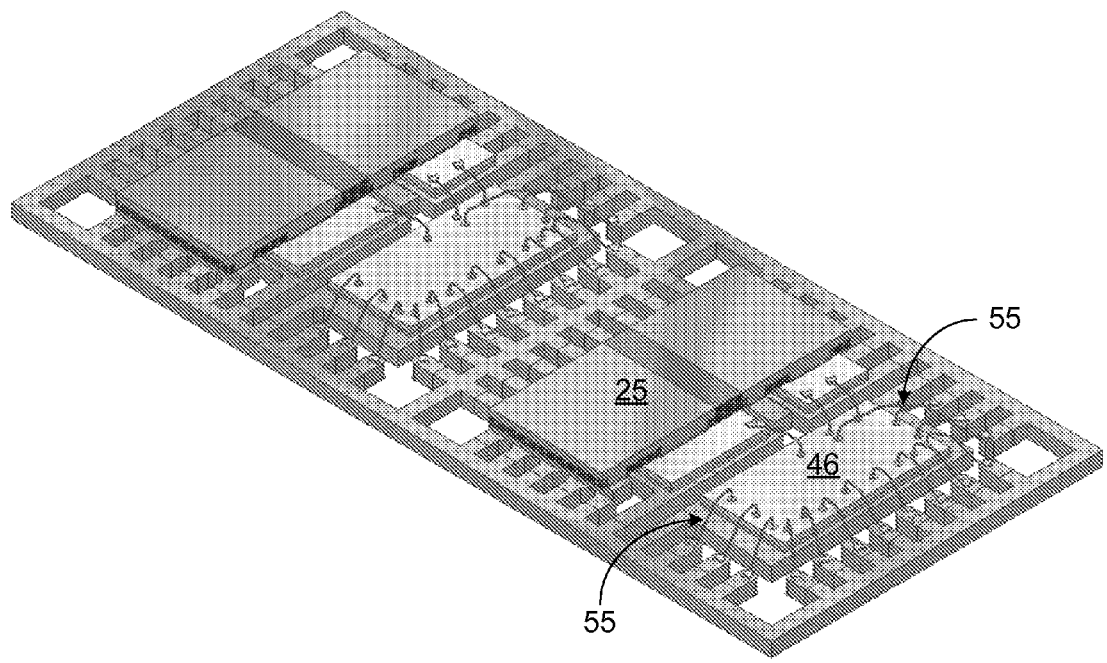
FIG. 10 depicts some embodiments of the wirebonding that can be used in a semiconductor package.

If needed, additional connections can be made between the different die(s) and/or between the die(s) and the leadframe 30. In some embodiments, this additional connection(s) can be made by any wirebonding process known in the art. As an example of the wirebonding, the desired portion of the die(s) can be provided with contacts pads on the desired location of the die and the desired location on the leadframe. After that, wirebonds 55 are formed from the contact pads to the desired connection points on the other dies and/or the leadframe 30 to form the electrical connection. The wirebonds 55 can be made from any conductive material known in the art, including Au or Cu, and using any process known in the art. The resulting structure after the wirebonds 55 have been formed is illustrated in FIG. 10.

Figure 11:
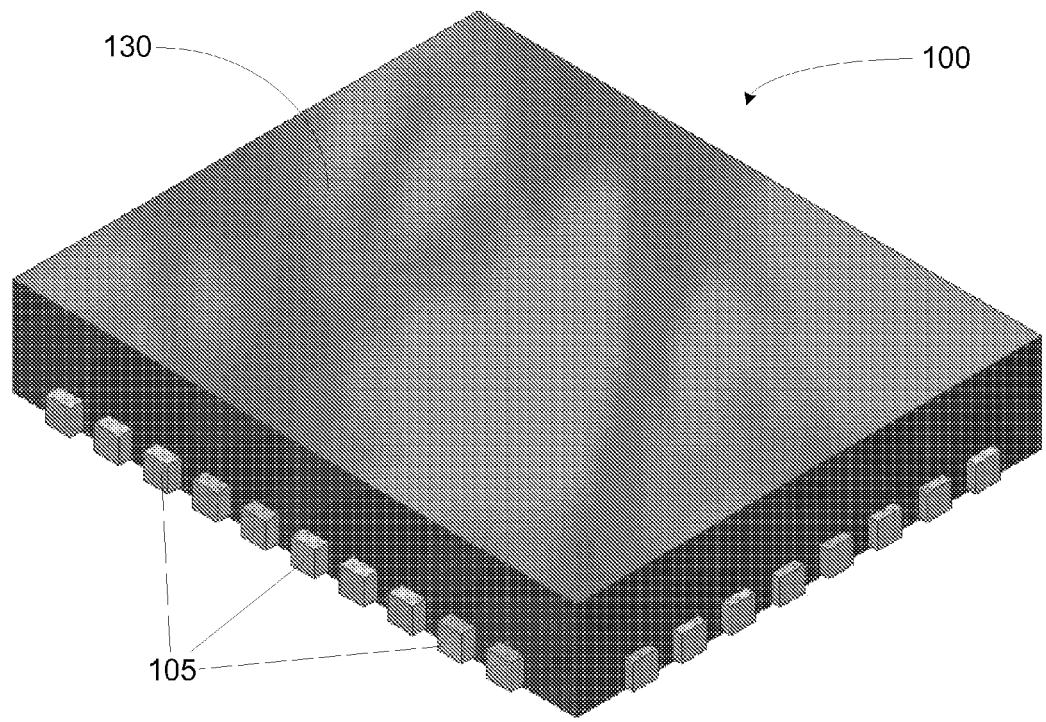
FIGS. 11 and 12 show some embodiments of an encapsulated semiconductor package.
Figure 12:
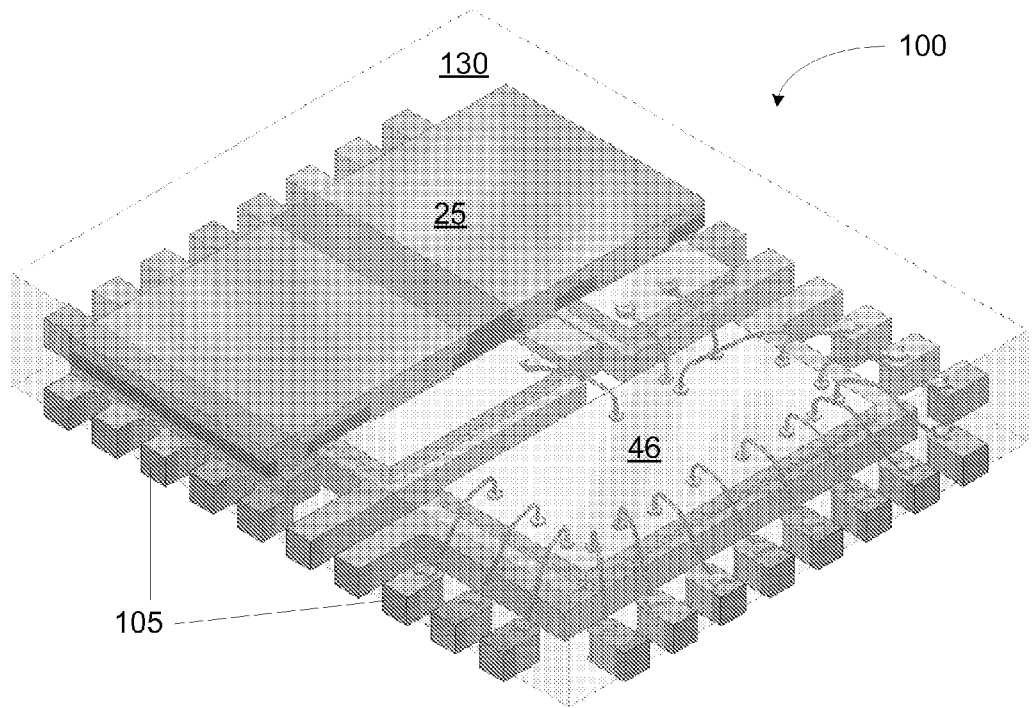

Next, the resulting structure is encapsulated to form the completed semiconductor package 100. The dies, the premolded clip 25, the wirebonds 50, and most of the leadframe 30 can be encapsulated in any molding material 130 known in the art, as shown in FIG. 11. FIG. 12 depicts the encapsulation as a transparent material for purposes of viewing the internal components. In some embodiments, the molding material 130 can comprise an epoxy molding compound, a thermoset resin, a thermoplastic material, or potting material. In other embodiments, the molding material comprises an epoxy molding compound. During the encapsulation process, certain sides of the leadframe 30 are not encapsulated, thereby forming the terminals 105 of the semiconductor package 100.

The semiconductor packages formed from this process contain two (or more) dies with devices that are connected to each other via a single premolded clip. The premolded clip 25 is kept substantially planar by using the standoffs on the leadframe on which the dies are located. The premolded clip increases the cross-sectional area of interconnection when compared to conventional wirebonding that is used. With an increased cross-sectional area, the electrical ($RDSO_{on}$) and the thermal performance of the semiconductor package is improved. In some configurations, one type of conventional semiconductor package used 8 Cu wires to connect the dies. Since the wires have a diameter of about 2 mils, the cross sectional area of the interconnection was about 25 square mils. But using a premolded clip for the same interconnection, yet with a folded standoff having a length of about 40 mils and a width of about 5 mils, provides a cross sectional area of about 200 square mils, yielding an increase of about 700%.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor package, comprising:
   a bottom surface of a first die connected to an upper surface of a leadframe;
   a bottom surface of a second die connected to an upper surface of the leadframe; and
   a premolded clip connected to an upper surface of the first die, an upper surface of the second die, and to a standoff formed on an upper surface of the leadframe.

2. The semiconductor package of claim 1, wherein the upper surface of the leadframe contains a plurality of standoffs to which the bottom surface of the premolded clip is connected.

3. The semiconductor package of claim 2, wherein the standoffs are formed on the gate and source leadpost of the leadframe.

4. The semiconductor package of claim 1, further comprising a third die wherein the bottom surface of the third die is connected to an upper surface of a leadframe.

5. The semiconductor package of claim 1, wherein the third die is connected to the first die and the second die by wirebonding.

6. The semiconductor package of claim 5, wherein the first die, the second die, the third die, or a combination of these dies are connected to the leadframe by wirebonding.

7. The semiconductor package of claim 1, further comprising a molding material encapsulating the first die, the second die, and the premolded clip.

8. The semiconductor package of claim 7, wherein the molding material also encapsulates the leadframe except for a portion of a side of that leadframe.

9. The semiconductor package of claim 1, wherein the standoff can have a folded configuration, an offset configuration, or a stepped configuration.

10. A semiconductor package, comprising:
    a bottom surface of a first die connected to an upper surface of a leadframe;
    a bottom surface of a second die connected to an upper surface of the leadframe; and
    a premolded clip connected to an upper surface of the first die, an upper surface of the second die, and to a plurality of standoffs formed on an upper surface of the leadframe.

11. The semiconductor package of claim 10, wherein the standoffs are formed on the gate and source leadpost of the leadframe.

12. The semiconductor package of claim 10, further comprising a third die wherein the bottom surface of the third die is connected to an upper surface of a leadframe.

13. The semiconductor package of claim 12, wherein the third die is connected to the first die and the second die by wirebonding.

14. The semiconductor package of claim 13, wherein the first die, the second die, the third die, or a combination of these dies are connected to the leadframe by wirebonding.

15. The semiconductor package of claim 10, further comprising a molding material encapsulating the first die, the second die, and the premolded clip.

16. The semiconductor package of claim 15, wherein the molding material also encapsulates the leadframe except for a portion of a side of that leadframe that operates as a terminal for the semiconductor package.

17. The semiconductor package of claim 15, wherein the standoff can have a folded configuration, an offset configuration, or a stepped configuration.

18. A method for making semiconductor package, comprising:
    providing a leadframe with an upper surface containing a standoff;
    connecting a bottom surface of a first die to an upper surface of the leadframe;
    connecting a bottom surface of a second die to an upper surface of the leadframe; and
    connecting a premolded clip to an upper surface of the first die, an upper surface of the second die, and to the standoff.

19. The method of claim 18, wherein the upper surface of the leadframe contains a plurality of standoffs to which the bottom surface of the premolded clip is connected.

20. The method of claim 18, further comprising connecting a bottom surface of a third die to an upper surface of a leadframe.

21. The method of claim 20, further comprising connecting the third die to the first die and the second die by wirebonding.

22. The method of claim 18, further comprising providing a molding material to encapsulate the first die, the second die, and the premolded clip.

23. The method of claim 18, wherein the molding material also encapsulates the leadframe except for a portion of a side of that leadframe that operates as a terminal for the semiconductor package.

24. The method of claim 18, wherein the standoff can have a folded configuration, an offset configuration, or a stepped configuration.

25. A method for making semiconductor package, comprising:
    providing a leadframe with an upper surface containing a standoff;
    connecting a bottom surface of a first die to an upper surface of the leadframe so that the upper surface of the first die is substantially planar with the standoff;
    connecting a bottom surface of a second die to an upper surface of the leadframe so that the upper surface of the second die is substantially planar with the standoff;
    forming a premolded clip from a separate leadframe;
    connecting a premolded clip to an upper surface of the first die, an upper surface of the second die, and to the standoff; and
    providing a molding material to encapsulate the first die, the second die, the premolded clip, and the leadframe except for a portion of a side of that leadframe that operates as a terminal for the semiconductor package.

* * * * *